US009210815B2

(12) United States Patent
Yu

(10) Patent No.: US 9,210,815 B2
(45) Date of Patent: Dec. 8, 2015

(54) METHOD OF MANUFACTURING EMBEDDED WIRING BOARD

(75) Inventor: Cheng-Po Yu, Taoyuan County (TW)

(73) Assignee: Unimicron Technology Corp., Taoyuan (TW)

( * ) Notice: Subject to any disclaimer, the term of this patent is extended or adjusted under 35 U.S.C. 154(b) by 806 days.

(21) Appl. No.: 13/474,735

(22) Filed: May 18, 2012

(65) Prior Publication Data

US 2012/0231179 A1 Sep. 13, 2012

Related U.S. Application Data

(62) Division of application No. 12/613,072, filed on Nov. 5, 2009, now Pat. No. 8,217,278.

(30) Foreign Application Priority Data

Aug. 25, 2009 (TW) ............................... 98128484 A

(51) Int. Cl.
*H05K 3/36* (2006.01)
*H05K 3/00* (2006.01)
*H05K 3/46* (2006.01)
*H05K 3/10* (2006.01)

(52) U.S. Cl.
CPC .............. *H05K 3/0035* (2013.01); *H05K 3/465* (2013.01); *H05K 3/107* (2013.01); *H05K 2201/0236* (2013.01); *H05K 2201/0959* (2013.01); *H05K 2201/09845* (2013.01); *H05K 2203/1476* (2013.01); *Y10T 29/49155* (2015.01)

(58) Field of Classification Search
CPC ................... H01L 23/49822; H01L 23/49827; H05K 3/4007
USPC ............ 29/830–831, 846–847, 852; 174/255, 174/262–265; 427/555, 98.5
See application file for complete search history.

(56) References Cited

U.S. PATENT DOCUMENTS

| | | | | |
|---|---|---|---|---|
| 5,308,929 | A * | 5/1994 | Tani et al. | 174/262 |
| 5,380,679 | A * | 1/1995 | Kano | 438/628 |
| 5,721,155 | A * | 2/1998 | Lee | 438/637 |
| 5,879,787 | A * | 3/1999 | Petefish | 428/209 |
| 6,240,636 | B1 * | 6/2001 | Asai et al. | 29/852 |
| 6,591,491 | B2 * | 7/2003 | Fujii et al. | 29/830 |
| 7,202,155 | B2 * | 4/2007 | Fukuchi | 438/622 |
| 7,615,707 | B2 * | 11/2009 | Lin | 174/262 |
| 7,737,367 | B2 * | 6/2010 | Koyama et al. | 174/264 |
| 7,745,933 | B2 * | 6/2010 | Yu | 257/750 |
| 8,217,278 | B2 * | 7/2012 | Yu | 174/262 |
| 2006/0191715 | A1 * | 8/2006 | Koyama et al. | 174/264 |
| 2008/0314633 | A1 * | 12/2008 | Kang et al. | 174/264 |
| 2008/0315431 | A1 * | 12/2008 | Ahn et al. | 257/774 |

* cited by examiner

*Primary Examiner* — Minh Trinh
(74) *Attorney, Agent, or Firm* — Jianq Chyun IP Office

(57) ABSTRACT

A manufacturing method of an embedded wiring board is provided. The method includes the following steps. First, an insulation layer and a lower wiring layer are provided, wherein the insulation layer includes a polymeric material. Then, the plural catalyst grains are distributed in the polymeric material. A groove and an engraved pattern are formed on the upper surface. A blind via is formed on a bottom surface of the groove to expose the lower pad. An upper wiring layer is formed in the engraved pattern. Some catalyst grains are exposed and activated in the groove, the engraved pattern and the blind via. A first conductive pillar is formed in the groove. Finally, a second conductive pillar is formed in the blind via.

14 Claims, 4 Drawing Sheets

METHOD OF MANUFACTURING EMBEDDED WIRING BOARD

CROSS-REFERENCE TO RELATED APPLICATION

This application is a divisional application of and claims the priority benefit of U.S. application Ser. No. 12/613,072, filed on Nov. 5, 2009, now allowed as U.S. Pat. No. 8,217, 278, which claims the priority benefit of Taiwan application serial no. 98128484, filed on Aug. 25, 2009, now allowed as Taiwan patent no. 1392425. The entirety of each of the above-mentioned patent applications is hereby incorporated by reference herein and made a part of specification.

BACKGROUND OF THE INVENTION

1. Field of the Invention

The present invention relates to a wiring board and a manufacturing method thereof, and more particularly to an embedded wiring board and a manufacturing method thereof.

2. Related Art

A wiring board is a necessary element for an electronic device such as a cellular phone, a computer or a digital camera, and a household appliance such as a TV, a washing machine or a refrigerator. In detail, the wiring board can be loaded and assembled with chips, passive elements and active elements, as well as allow these electronic elements to be electrically connected with one another. As a result, an electrical signal can be transmitted among these electronic elements, enabling the aforementioned electronic devices and household appliances to operate.

SUMMARY OF THE INVENTION

The object of the present invention is to a manufacturing method of an embedded wiring board to manufacture the aforementioned embedded wiring board.

The present invention provides a manufacturing method of an embedded wiring board. The method comprises: providing an insulation layer and a lower wiring layer, wherein the insulation layer is provided with an upper surface and a lower surface opposite to the upper surface, the lower wiring layer is located at the lower surface and includes a lower pad which is embedded in the lower surface; forming a groove and an engraved pattern on the upper surface, wherein a depth of the groove relative to the upper surface is larger than a depth of the engraved pattern relative to the upper surface; forming a blind via on a bottom surface of the groove to expose the lower pad; forming an upper wiring layer in the engraved pattern; forming a first conductive pillar in the groove; and forming a second conductive pillar in the blind via, wherein the second conductive pillar is connected between the first conductive pillar and the lower pad.

As a second conductive pillar is connected between a first conductive pillar and a lower pad, an upper wiring layer and a lower wiring layer can be electrically conducted, and through an upper pad and the lower pad, the embedded wiring board of the present invention can be assembled with the electronic elements.

To enable a further understanding of the objectives and the technological methods of the invention herein, the brief description of the drawings below is followed by the detailed description of the preferred embodiments.

DETAILED DESCRIPTION OF THE PREFERRED EMBODIMENTS

Figure 1A:
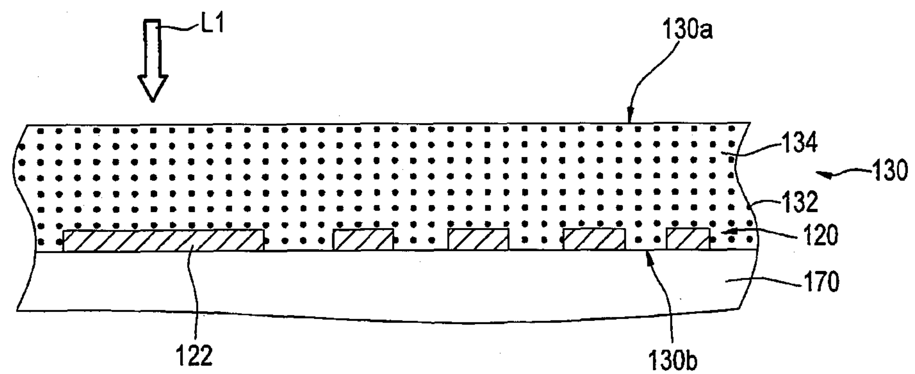
FIG. 1A, FIG. 1B, FIG. 1C, FIG. 1D and FIG. 1E show cutaway views of a flow process of an embodiment of a manufacturing method of an embedded wiring board, according to the present invention.
Figure 1B:
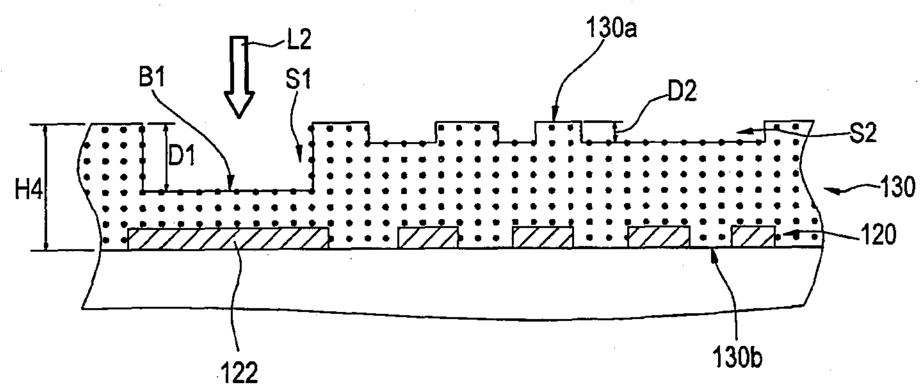
Figure 1C:
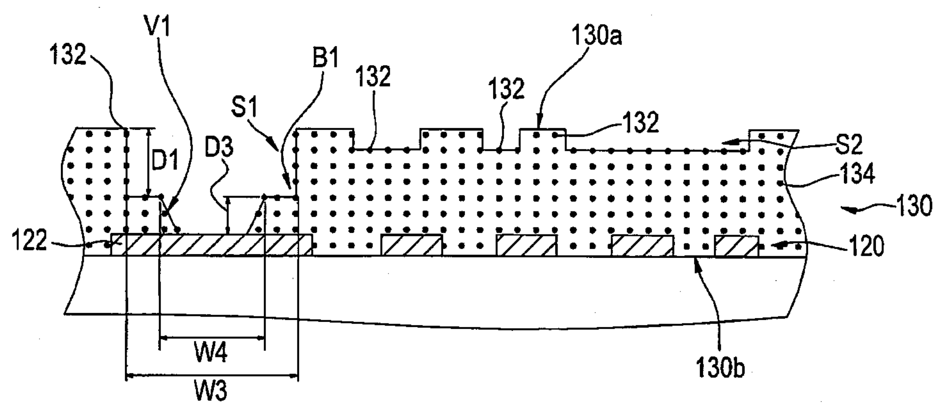
Figure 1D:
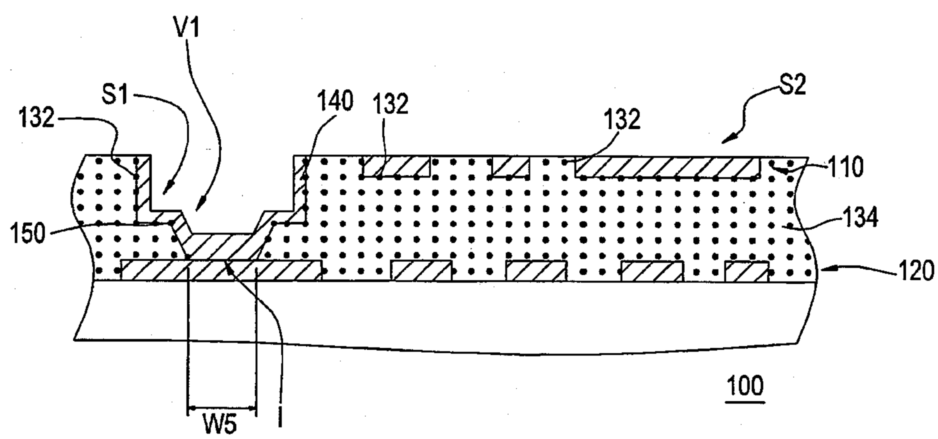
Figure 1E:
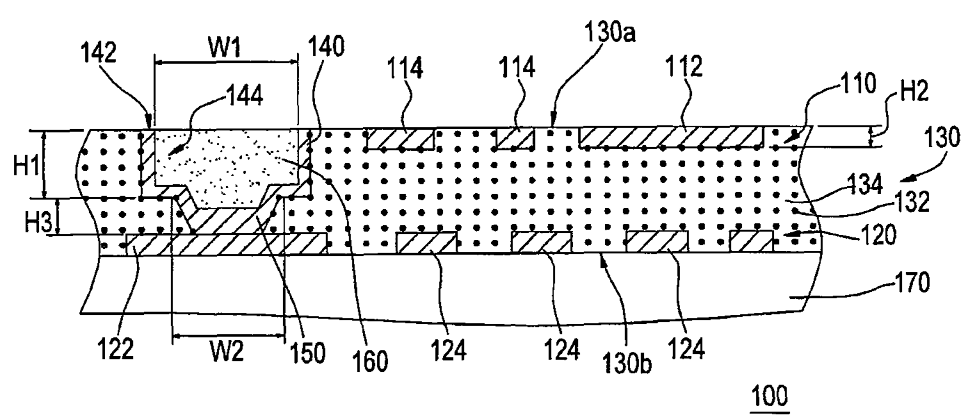

FIG. 1A, FIG. 1B, FIG. 1C, FIG. 1D and FIG. 1E show cutaway views of a flow process of an embodiment of a manufacturing method of an embedded wiring board, according to the present invention. As shown in FIG. 1E, a structure of an embedded wiring board 100 of the present embodiment is disclosed first. The embedded wiring board 100 comprises an upper wiring layer 110, a lower wiring layer 120, an insulation layer 130, at least one first conductive pillar 140 and at least one second conductive pillar 150.

Specifically, the insulation layer 130 is provided with an upper surface 130*a* and a lower surface 130*b* which is opposite to the upper surface 130*a*, wherein the upper wiring layer 110 is located at the upper surface 130*a* and the lower wiring layer 120 is located at the lower surface 130*b*. In other words, the upper wiring layer 110 and the lower wiring layer 120 are located respectively at two opposite sides of the insulation layer 130.

The upper wiring layer 110 includes at least one upper pad 112 and the lower wiring layer 120 includes at least one lower pad 122, wherein the upper pad 112 is embedded in the upper surface 130*a* and the lower pad 122 is embedded in the lower surface 130*b*. On the other hand, the upper wiring layer 110 can further include plural traces 114 which are embedded in the upper surface 130*a*, and the lower wiring layer 120 can further include plural traces 124, at least one of which is electrically connected with the upper pad 112.

Although one upper pad 112 and one lower pad 122 are shown in FIG. 1E, in other embodiments which are not shown, the upper wiring layer 110 can include plural upper pads 112 and the lower wiring layer 120 can include plural lower pads 122. In addition, in other embodiments that are not shown, the upper wiring layer 110 can include only one trace 114, and the lower wiring layer 120 can include only one trace 124.

The first conductive pillar 140 is located in the insulation layer 130 and is provided with an end surface 142, wherein the upper surface 130*a* of the insulation layer 130 exposes the end surface 142. However, in the present embodiment, the end surface 142 can be physically aligned with the upper surface 130*a*. Furthermore, a height H1 of the first conductive pillar 140 relative to the upper surface 130*a* is larger than a depth H2 of the upper pad 112 relative to the upper surface 130*a*, as shown in FIG. 1E.

A depth of these traces 114 relative to the upper surface 130*a* can be physically equal to the depth H2. Therefore, the height H1 of the first conductive pillar 140 relative to the upper surface 130*a* is also larger than the depth of the traces 114 relative to the upper surface 130*a*. Besides, in other embodiments that are not shown, whether the depth H2 of the upper pad 112 is equal to the depth of the traces 114, the height H1 is still larger than the depth of the traces 114 relative to the upper surface 130_a_.

The second conductive pillar 150 is located in the insulation layer 130 and is connected between the first conductive pillar 140 and the lower pad 122, wherein the second conductive pillar 150 is configured between the first conductive pillar 140 and the lower pad 122 and is extended downward from the first conductive pillar 140 to the lower pad 122. Besides, the second conductive pillar 150 can be tapered from the first conductive pillar 140 toward the lower pad 122, forming a cone-shaped body. In addition, the first conductive pillar 140 and the second conductive pillar 150 can be formed integrally.

Accordingly, a ratio of the height H1 of the first conductive pillar 140 relative to the upper surface 130_a_ to a height H3 of the second conductive pillar 150 relative to the lower pad 122 can be larger than 0.5. For example, this ratio can be no less than 0.75; that is, the ratio is equal to or larger than 0.75. Moreover, the height H1 of the first conductive pillar 140 relative to the upper surface 130_a_ can be no less than the height H3 of the second conductive pillar 150 relative to the lower pad 122; that is, the height H1 can be larger than or equal to the height H3. For example, a ratio of the height H1 to the height H3 can be no less than 1.0. When the height H1 is equal to the height H3, lengths of the first conductive pillar 140 and the second conductive pillar 150 (that is, the heights H1 and H3) are physically identical. On the other hand, an outer diameter W1 of the first conductive pillar 140 can be larger than an outer diameter W2 of the second conductive pillar 150.

The first conductive pillar 140 can be a hollow cylinder and is provided with a through-hole 144; whereas, the embedded wiring board 100 can further include a filling material 160. The filling material 160 is filled into the through-hole 144 and can be a conductive material, such as graphite, a metallic material or a polymeric conductive material, wherein the metallic material can be a conductive adhesive like a sliver adhesive or a conductive paste like a copper paste. Besides, the filling material 160 can be also an insulation material, such as an organic or inorganic insulation material.

On the other hand, the embedded wiring board 100 can further include an inner substrate 170 which is configured at the lower surface 130_b_ of the insulation layer 130, and the lower wiring layer 120 is located between the inner substrate 170 and the insulation layer 130. In detail, the inner substrate 170 can be a wiring substrate; that is, the inner substrate 170 is provided with a layout (not shown in FIG. 1E) and plural conductive connection structures (not shown in FIG. 1E).

The aforementioned conductive connection structures can be conductive through-hole structures or conductive blind via structures, and the lower wiring layer 120 is electrically connected with these conductive connection structures. As a result, the lower wiring layer 120 can be electrically connected with the inner substrate 170, and the embedded wiring board 100 can be a multi-layered wiring board including plural layers of circuits.

However, it needs to be disclosed that in other embodiments not shown, the embedded wiring board 100 can be a double-sided wiring board. In other words, the embedded wiring board 100 can only include the upper wiring layer 110 and the lower wiring layer 120, without using the inner substrate 170. Hence, the inner substrate 170 as shown in FIG. 1E is only used for an example, not for limiting technological features of the present invention.

It is worthy of mentioning that in FIG. 1E, the insulation layer 130 can include a polymeric material 134 and plural catalyst grains 132 which are distributed in the polymeric material 134. These catalyst grains 132 can be plural nano-grains and can contain metals.

In detail, these nano-grains contain metallic atoms or metallic ions and these catalyst grains 132 include a metal coordination compound such as a metal oxide, a metal nitride, a metal complex or a metal chelate, wherein the metal coordination compound is chosen from zinc, copper, silver, gold, nickel, aluminum, palladium, platinum, cobalt, rhodium, iridium, indium, iron, manganese, chromium, molybdenum, tungsten, vanadium, tantalum, titanium or any combination of these metals.

In addition, the catalyst grains 132 can include plural kinds of metal coordination compounds. In detail, the catalyst grains 132 can be chosen from a metal oxide, a metal nitride, a metal complex, a metal chelate or any combination of these compounds.

For example, these catalyst grains 132 can include a metal oxide, a metal nitride or a metal complex, or the catalyst grains 132 can include plural kinds of metal coordination compounds of the metal oxide and the metal complex, such as aluminum nitride, copper oxide, titanium nitride, cobalt molybdenum bimetallic nitride (Co2Mo3Nx) or palladium.

The polymeric material 134 is chosen from epoxy resin, modified epoxy resin, polyester, acrylate, fluoro-polymer, polyphenylene oxide, polyimide, phenolicresin, polysulfone, silicone polymer, bismaleimide triazine modified epoxy (or the so-called BT resin), cyanate ester, polyethylene, polycarbonate (PC), acrylonitrile-butadiene-styrene (ABS) copolymer, polyethylene terephthalate (PET), polybutylene terephthalate (PBT), liquid crystal polymer (LCP), polyimide 6 (PA 6), nylon, polyoxymethylene (POM), polyphenylene sulfide (PPS), cyclic olefin copolymer (COC) or any combination of these materials.

In manufacturing the embedded wiring board 100, these catalyst grains 132 can facilitate forming the upper wiring layer 110, the lower wiring layer 120, the first conductive pillar 140 and the second conductive pillar 150, whereas, the function of the catalyst grains 132 will be described hereinafter. Nevertheless, it should be emphasized that in other embodiments not shown, the insulation layer 130 can be a pre-impregnated composite fiber (prepreg) or a resin layer which is commonly seen in the field of wiring board technology and these catalyst grains 132 are not needed. Therefore, these catalyst grains 132 are not the necessary elements.

Hereinabove only the structure of the embedded wiring board 100 is described. In the following, a manufacturing method of the embedded wiring board 100 is described in detail, in association with FIGS. 1A to 1E.

As shown in FIG. 1A, regarding to the manufacturing method of the embedded wiring board 100, first of all, the insulation layer 130 and the lower wiring layer 120 are provided, wherein the lower wiring layer 120 is located at the lower surface 130_b_ of the insulation layer 130 and includes the lower pad 122 that is embedded in the lower surface 130_b_. The insulation layer 130 can include the polymeric material 134 and the catalyst grains 132, but in other embodiments not shown, the insulation layer 130 can be the pre-impregnated composite fiber or the resin layer, without requiring these catalyst grains 132.

On the other hand, the present embodiment can further provide the inner substrate 170 which is configured at the lower surface 130_b_ of the insulation layer 130 and can be a wiring substrate. In detail, after the lower wiring layer 120 and the inner substrate 170 have been formed, the insulation layer 130 can be formed on the inner substrate 170, wherein the insulation layer 130 fully covers the lower wiring layer 120 and can be formed through pressing the prepreg or an adhesive material containing these catalyst grains 132.

It should be described that in other embodiments not shown, it does not need to provide the inner substrate 170. In details, the insulation layer 130 can use a harder insulation board with a blank core layer and the lower wiring layer 120 can be formed in advance at the lower surface 130*b*, wherein the lower wiring layer 120 can be formed by electroless plating or electroplating. Therefore, the inner substrate 170 shown in FIGS. 1A to 1E is only used as an example, and does not limit the technological features of the present invention.

Referring to FIG. 1A and FIG. 1B, next, the upper surface 130*a* of the insulation layer 130 is formed with at least one groove S1 and one engraved pattern S2, wherein a depth D1 of the groove S1 relative to the upper surface 130*a* is larger than a depth D2 of the engraved pattern S2 relative to the upper surface 130*a*, and the depth D1 of the groove S1 is smaller than a depth H4 of the insulation layer 130; that is, the groove S1 is not formed by penetrating the insulation layer 130.

The groove S1 can be formed by a mechanical drilling method or irradiating a first laser beam L1 on the upper surface 130*a* to ablate the insulation layer 130. Thus, the groove S1 is formed. In addition, the engraved pattern S2 can be also formed by ablating the insulation layer 130 with the first laser beam L1 or by a lithographing and etching method.

Referring to FIG. 1B and FIG. 1C, next, a bottom surface B1 of the groove S1 is formed with a blind via V1, wherein the blind via V1 exposes the lower pad 122 of the lower wiring layer 120. In other words, the blind via V1 is extended from the bottom surface B1 to the lower pad 122. A width W3 of the groove S1 can be larger than an aperture W4 of the blind via V1, and a ratio of the depth D1 of the groove S1 relative to the upper surface 130*a* to a depth D3 of the blind via V1 relative to the lower pad 122 can be larger than 0.5. For example, this ratio can be no less than 0.75, i.e., equal to or larger than 0.75. Besides, in other embodiments, the depth D1 can be no less than the depth D3; that is, the depth D1 can be larger than or physically equal to the depth D3, for example, the ratio of the depth D1 to the depth D3 can be no less than 1.0.

The blind via V1 can be formed by irradiating a second laser beam L2 on the bottom surface B1 to ablate the insulation layer 130. Thus, the blind via V1 is formed. Furthermore, wavelengths of the laser beams L1, L2 can be in a range of visible light, infrared light or ultraviolet light. Therefore, a laser source which releases the laser beam L1 or L2 can be an infrared laser, an ultraviolet laser, a yttrium aluminum garnet (YAG) laser, a carbon dioxide laser, a quasi-molecular laser or a far infrared laser.

Figure 2A:
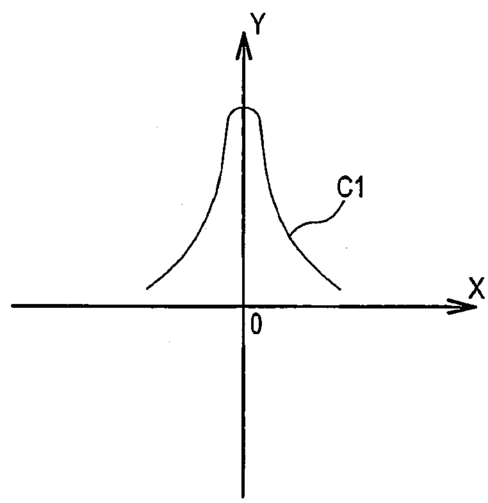
FIG. 2A shows a schematic view of a spatial energy distribution of a laser beam which is used to form a groove in FIG. 1B.
Figure 2B:
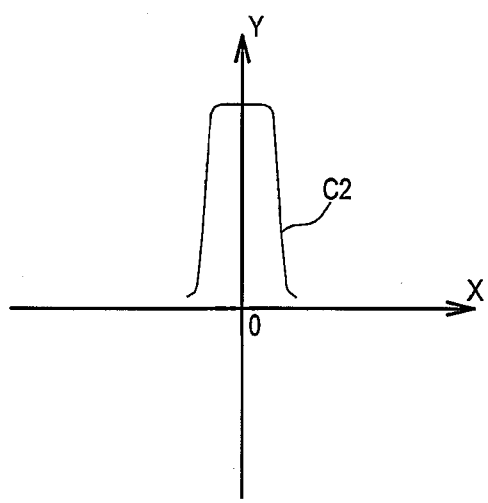
FIG. 2B shows a schematic view of a spatial energy distribution of a laser beam which is used to form a blind via in FIG. 1C.

On the other hand, a spatial energy distribution of the first laser beam L1 is different from that of the second laser beam L2. Referring to FIG. 2A and FIG. 2B, FIG. 2A shows a schematic view of a spatial energy distribution of the first laser beam L1 and FIG. 2B shows a schematic view of a spatial energy distribution of the second laser beam L2.

In FIG. 2A and FIG. 2B, an abscissa X represents a distance and a position of the laser beam relative to an optical axis (i.e., a central axis of the laser beam) on a cross section of the laser beam, and an ordinate axis Y represents energy of the laser beam, wherein an origin 0 on the abscissa X represents the position of the optical axis on the cross section.

Accordingly, from an energy distribution curve C1 shown in FIG. 2A, the spatial energy distribution of the first laser beam L1 of FIG. 1A is a Gaussian distribution; that is, the energy of the first laser beam L1 decreases gradually outward from the optical axis. Therefore, the energy of the first laser beam L1 is the largest at the optical axis and is the smallest at an edge.

It can be shown from an energy distribution curve C2 in FIG. 2B, the spatial energy distribution of the second laser beam L2 of FIG. 1B is in a derby hat shape; that is, an energy difference of the second laser beam L2 at any place of the cross section is very small and hence, the spatial energy of the second laser beam L2 is physically uniformly distributed.

Referring to FIG. 1C and FIG. 1D, after the blind via V1 has been formed, the upper wiring layer 110 is formed in the engraved pattern S2, the first conductive pillar 140 is formed in the groove S1, and the second conductive pillar 150 is formed in the blind via V1. The upper wiring layer 110, the first conductive pillar 140 and the second conductive pillar 150 can be formed by electroless plating. Accordingly, the embedded wiring board 100 is basically manufactured at this moment.

As the insulation layer 130 can include the polymeric material 134 and the catalyst grains 132 that are distributed in the polymeric material 134, after the groove S1, the engraved pattern S2 and the blind via V1 have been formed, some catalyst grains 132 will be exposed and activated in the groove S1, the engraved pattern S2 and the blind via V1, as shown in FIG. 1C.

In detail, chemical bonds of these catalyst grains 132 can be broken up by the laser beam and plasma; therefore, the method to activate these catalyst grains 132 can be carrying out the laser ablation or plasma etching to the insulation layer 130. In other words, the laser beams L1, L2 can not only ablate the insulation layer 130, but activate these catalyst grains 132 in the groove S1, the engraved pattern S2 and the blind via V1.

Accordingly, chemical agents of the electroless plating that is used to form the upper wiring layer 110, the first conductive pillar 140 and the second conductive pillar 150 can directly react with the activated catalyst grains 132 to deposit a metallic material in the engraved pattern S2, the groove S1 and the blind via V1, thereby forming the upper wiring layer 110, the first conductive pillar 140 and the second conductive pillar 150. Furthermore, in addition to the electroless plating, a chemical vapor deposition (CVD) method can be also used to form the upper wiring layer 110, the first conductive pillar 140 and the second conductive pillar 150.

As in other embodiments not shown, the insulation layer 130 does not include these catalyst grains 132 and can be the prepreg or the resin layer, the upper wiring layer 110, the first conductive pillar 140 and the second conductive pillar 150 can be formed by the electroless plating and the electroplating at a same time.

In detail, the electroless plating can be performed first to form electroplate seed layers in the engraved pattern S2, the groove S1 and the blind via V1. After that, an electric current is introduced to proceed the electroplating and to deposit the metallic material in the engraved pattern S2, the groove S1 and the blind via V1. Besides, whether using the electroless plating alone or using the electroless plating and the electroplating at a same time, the first conductive pillar 140 and the second conductive pillar 150 can be formed simultaneously and can be formed integrally.

Accordingly, the ratio of the depth D1 to the depth D3 (as shown in FIG. 1C) can be larger than 0.5, and comparing to a blind via of a conventional wiring board, the blind via V1 is provided with a smaller aspect ratio; therefore, it is beneficial to carry out the electroless plating or the electroplating, allowing the metallic material to be easily deposited in the blind via V1, thereby improving an electric quality of the second conductive pillar 150 and a yield factor of the embedded wiring board 100.

On the other hand, the ratio of the depth D1 to the depth D3 can be further no less than 0.75 or no less than 1. When the ratio of the depth D1 to the depth D3 increases, a width W5 and an area of a contact surface I between the second conductive pillar 150 and the lower pad 122 can increase too, thereby improving a quality of electric connection and a confidence level between the second conductive pillar 150 and the lower pad 122.

Moreover, in other embodiments not shown, the electroplating can be utilized to fill the groove S1 and the blind via V1, allowing the first conductive pillar 140 and the second conductive pillar 150 to become solid cylinders. Hence, the first conductive pillar 140 can be not only the hollow cylinder, but the solid cylinder in other embodiments that are not shown.

Referring to FIG. 1E, when the first conductive pillar 140 is the hollow cylinder, after the upper wiring layer 110, the first conductive pillar 140 and the second conductive pillar 150 have been formed, the filling material 160 can be filled into the through-hole 144 of the first conductive pillar 140 to bury the through-hole 144, wherein the filling material 160 can be filled into the through-hole 144 by a printing method.

Accordingly, the upper wiring layer and the lower wiring layer are electrically conducted through the first conductive pillar and the second conductive pillar and by using the upper pad and the lower pad, the embedded wiring board of the present invention can be assembled with electronic elements, thereby allowing plural electronic elements to be electrically connected with one another.

On the other hand, as the depth of the groove relative to the upper surface of the wiring board is larger than the depth of the engraved pattern relative to the upper surface, the present invention can reduce the aspect ratio of the blind via below the groove. Therefore, the present invention facilitates using the electroless plating or the electroplating to form the second conductive pillar, thereby improving the electric quality of the second conductive pillar and the yield factor of the embedded wiring board.

Moreover, comparing to the prior art, in the embedded wiring board of the present invention, the larger contact area is provided between the second conductive pillar and the lower pad that is connected with the second conductive pillar. Hence, the present invention can improve the quality of the electric connection and the confidence level between the second conductive pillar and the lower pad.

It is of course to be understood that the embodiments described herein is merely illustrative of the principles of the invention and that a wide variety of modifications thereto may be effected by persons skilled in the art without departing from the spirit and scope of the invention as set forth in the following claims.

What is claimed is:

1. A manufacturing method of an embedded wiring board, comprising:
   - providing an insulation layer and a lower wiring layer, wherein the insulation layer includes a polymeric material, the insulation layer is provided with an upper surface and a lower surface opposite to the upper surface, the lower wiring layer is located at the lower surface and includes a lower pad which is embedded in the lower surface;
   - distributing a plural catalyst grains in the polymeric material;
   - forming a groove and an engraved pattern on the upper surface, wherein a depth of the groove relative to the upper surface is larger than a depth of the engraved pattern relative to the upper surface;
   - fondling a blind via on a bottom surface of the groove to expose the lower pad;
   - exposing and activating some catalyst grains in the groove, the engraved pattern, and the blind via;
   - forming an upper wiring layer in the engraved pattern;
   - forming a first conductive pillar in the groove; and forming a second conductive pillar in the blind via, wherein the second conductive pillar is connected between the first conductive pillar and the lower pad.

2. The manufacturing method of an embedded wiring board according to claim 1, wherein a method of forming the groove is irradiating a first laser beam on the upper surface to ablate the insulation layer.

3. The manufacturing method of an embedded wiring board according to claim 2, wherein a spatial energy distribution of the first laser beam is a Gaussian distribution.

4. The manufacturing method of an embedded wiring board according to claim 2, wherein a method of forming the engraved pattern is ablating the insulation layer with the first laser beam.

5. The manufacturing method of an embedded wiring board according to claim 1, wherein a method of forming the blind via is irradiating a second laser beam on the bottom surface to ablate the insulation layer.

6. The manufacturing method of an embedded wiring board according to claim 5, wherein a spatial energy distribution of the second laser beam is a flat top distribution.

7. The manufacturing method of an embedded wiring board according to claim 1, wherein a method of forming the groove is a mechanical drilling method.

8. The manufacturing method of an embedded wiring board according to claim 1, wherein a ratio of a depth of the groove relative to the upper surface to a depth of the blind via relative to the lower pad is larger than 0.5.

9. The manufacturing method of an embedded wiring board according to claim 1, wherein the depth of the groove relative to the upper surface is no less than the depth of the blind via relative to the lower pad.

10. The manufacturing method of an embedded wiring board according to claim 1, wherein a width of the groove is larger than an aperture of the blind via.

11. The manufacturing method of an embedded wiring board according to claim 1, wherein a method of forming the upper wiring layer, the first conductive pillar and the second conductive pillar is electroless plating.

12. The manufacturing method of an embedded wiring board according to claim 11, wherein a method of forming the upper wiring layer, the first conductive pillar and the second conductive pillar is electroplating.

13. The manufacturing method of an embedded wiring board according to claim 1, wherein the first conductive pillar is a hollow cylinder and after the second conductive pillar has been formed, the manufacturing method further comprises filling a filling material into a through-hole of the first conductive pillar by a printing method.

14. The manufacturing method of an embedded wiring board according to claim 1, wherein a step of forming the first conductive pillar and a step of forming the second conductive pillar are performed at a same time.

* * * * *